US011318524B2

(12) United States Patent
Goll et al.

(10) Patent No.: US 11,318,524 B2
(45) Date of Patent: May 3, 2022

(54) METHOD FOR PRODUCING A CONTAINER

(71) Applicant: Continental Teves AG & Co. OHG, Frankfurt am Main (DE)

(72) Inventors: Manfred Goll, Glauburg (DE); Martin Haverkamp, Frankfurt am Main (DE); Gerhard Sticksel, Gelnhausen-Haitz (DE)

(73) Assignee: Continental Teves AG & Co. OHG, Frankfurt am Main (DE)

( * ) Notice: Subject to any disclaimer, the term of this patent is extended or adjusted under 35 U.S.C. 154(b) by 468 days.

(21) Appl. No.: 16/099,062

(22) PCT Filed: May 11, 2017

(86) PCT No.: PCT/DE2017/200042
§ 371 (c)(1),
(2) Date: Nov. 5, 2018

(87) PCT Pub. No.: WO2017/220090
PCT Pub. Date: Dec. 28, 2017

(65) Prior Publication Data
US 2019/0143393 A1 May 16, 2019

(30) Foreign Application Priority Data
Jun. 21, 2016 (DE) ...................... 10 2016 211 018.7

(51) Int. Cl.
*B21D 51/52* (2006.01)
*B21D 51/04* (2006.01)
(Continued)

(52) U.S. Cl.
CPC ........... *B21D 51/52* (2013.01); *B21D 35/001* (2013.01); *B21D 51/04* (2013.01); *B21D 51/16* (2013.01);
(Continued)

(58) Field of Classification Search
CPC ........ B21D 51/52; B21D 51/16; B21D 51/04; B21D 35/001; B65B 41/16; B65B 47/10;
(Continued)

(56) References Cited

U.S. PATENT DOCUMENTS 4,611,456 A * 9/1986 Gillio-tos ................ B65B 11/52
53/427
5,270,641 A 12/1993 Van Loan et al.
(Continued)

FOREIGN PATENT DOCUMENTS

CN      1301041 A    6/2001
CN    203600783 U    5/2014
(Continued)

OTHER PUBLICATIONS

European Office Action in European Patent Application No. 17 730 367.4, dated Oct. 17, 2019, 5 pages, with partial English translation, 3 pages.
(Continued)

*Primary Examiner* — Livius R. Cazan
(74) *Attorney, Agent, or Firm* — W. F. Fasse

(57) ABSTRACT

A method for producing a container having an upper part, a lower part and a receiving element such as an electronics module includes the following steps: the lower part is created from a first starting material in a first processing region of a processing device; the upper part is created from a second starting material in a second processing region of the processing device; the receiving element is fed into the first processing region of the processing device; the lower part receives the receiving element in the first processing region of the processing device; the upper part is fed from the second processing region into the first processing region of the processing device; and there the upper part and the lower part are joined together to form the container.

15 Claims, 8 Drawing Sheets

(51) Int. Cl.
| | |
|---|---|
| *B65D 6/02* | (2006.01) |
| *H05K 5/00* | (2006.01) |
| *B21D 35/00* | (2006.01) |
| *B21D 51/16* | (2006.01) |
| *B65B 41/16* | (2006.01) |
| *B65B 47/10* | (2006.01) |
| *B65B 9/04* | (2006.01) |
| *B65B 61/00* | (2006.01) |
| *B65B 23/00* | (2006.01) |
| *B65B 55/00* | (2006.01) |
| *B65B 51/10* | (2006.01) |

(52) U.S. Cl.
CPC .............. *B65B 9/045* (2013.01); *B65B 23/00* (2013.01); *B65B 41/16* (2013.01); *B65B 47/10* (2013.01); *B65B 55/00* (2013.01); *B65B 61/00* (2013.01); *B65D 7/06* (2013.01); *H05K 5/0047* (2013.01); *B65B 51/10* (2013.01)

(58) Field of Classification Search
CPC ......... B65B 9/045; B65B 61/00; B65B 23/00; B65B 55/00; H05K 5/0047
See application file for complete search history.

(56) References Cited

U.S. PATENT DOCUMENTS

| | | | |
|---|---|---|---|
| 6,031,732 | A | 2/2000 | Koike et al. |
| 7,626,832 | B2 | 12/2009 | Muramatsu et al. |
| 8,243,454 | B2 | 8/2012 | Oota |
| 2001/0004314 | A1 | 6/2001 | Copetti et al. |
| 2015/0096263 | A1* | 4/2015 | Ehrmann ................. B65B 9/04 53/411 |
| 2015/0373867 | A1 | 12/2015 | Ochoa Reyes et al. |
| 2016/0297122 | A1 | 10/2016 | Fischer et al. |

FOREIGN PATENT DOCUMENTS

| | | |
|---|---|---|
| CN | 105391008 A | 3/2016 |
| CN | 105899913 A | 8/2016 |
| DE | 1 924 421 | 11/1970 |
| DE | 202 15 425 U1 | 2/2004 |
| DE | 602005005366 | 4/2009 |
| DE | 102012006787 | 10/2013 |
| EP | 0397185 A1 * | 11/1990 ........... H05K 9/0067 |
| EP | 1717150 A1 * | 11/2006 ............ B65B 35/18 |
| EP | 2 860 119 | 4/2015 |
| FR | 2 846 476 | 4/2004 |
| GB | 2 396 062 | 6/2004 |
| JP | 53-079688 A | 7/1978 |
| JP | 54-130271 U | 9/1979 |
| JP | 04-031496 B | 5/1992 |
| JP | 2011-023459 A | 2/2011 |
| JP | 2011-148364 A | 8/2011 |
| JP | 4969661 B2 | 7/2012 |
| JP | 5071447 B2 | 11/2012 |
| JP | 2015-048079 A | 3/2015 |

OTHER PUBLICATIONS

English translation of the International Search Report of the International Searching Authority for International Application PCT/DE2017/200042, dated Aug. 7, 2017, 2 pages, European Patent Office, HV Rijswijk, Netherlands.

PCT International Preliminary Report on Patentability including English Translation of PCT Written Opinion of the International Searching Authority for International Application PCT/DE2017/200042, dated Dec. 25, 2018, 7 pages, International Bureau of WIPO, Geneva, Switzerland.

German Search Report for German Patent Application No. 10 2016 211 018.7, dated Apr. 11, 2017, 7 pages, German Patent and Trademark Office, Muenchen, Germany, with partial English translation, 5 pages.

Japanese Office Action in Japanese Patent Application No. 2018-547332, dated Nov. 18, 2020, 2 pages; with English Partial Summary, 2 pages.

Wikipedia, "In-Circuit Test (ICT)", Retrieved from "https://en.wikipedia.org/w/index.php?title=In-circuit_test&oldid=1003565097" on Sep. 17, 2021, last edited on Jan. 29, 2021, 3 pages.

* cited by examiner

5th step, Station IV      IV

5th step, Station IV

METHOD FOR PRODUCING A CONTAINER

TECHNICAL FIELD

The present invention relates to a method for producing a container, in particular a container for electronic modules.

TECHNICAL BACKGROUND

Electronic modules, for example populated printed circuit boards, are usually inserted into containers which are produced separately for this purpose, generally in two parts, and then secured. The containers are then sealed.

In order to produce such a container, the parts of a container are usually produced from plastic using the injection molding method, while the metallic parts of the container are produced using sintering or respectively embossing and punching techniques. As a result, the container is produced in a plurality of different production stations, thus increasing the production costs of the container.

DESCRIPTION OF THE INVENTION

It is therefore the object of the present invention to provide a more efficient method for producing a container, in particular a container for electronic modules.

This object can be achieved by a method of producing a container, according to the invention as set forth herein.

The invention is based on the realization that the above object can be achieved by directly producing a container and mounting the electronic modules in the container, using one production device.

According to a first aspect, the object is achieved by a method for producing a container having an upper part, a lower part and a receiving element. The method has at least the following steps: the lower part is created from a first starting material in a first processing region of a processing device, the upper part is created from a second starting material in a second processing region of the processing device, the receiving element is fed into the first processing region of the processing device, the lower part receives the receiving element in the first processing region of the processing device, the upper part is fed from the second processing region of the processing device into the first processing region of the processing device and the upper part and the lower part are joined together to form the container in the first processing region of the processing device.

This achieves the technical advantage, for example, that the upper part and the lower part of the container can be produced in the same production device.

Furthermore, this achieves the technical advantage that only low costs are incurred for the production of the container, in particular for the fabrication and mounting concept.

Furthermore, this achieves the technical advantage that the receiving element can be installed and checked in the same production device, in which the upper part and the lower part of the container are produced. The receiving element can be a pre-fabricated electronic module.

According to a preferred embodiment, the lower part is created from a first starting material and/or the upper part is created from a second starting material by reshaping the first starting material and/or the second starting material.

According to another preferred embodiment, the reshaping comprises deep-drawing.

According to another preferred embodiment, the reshaping comprises unwinding the first starting material and/or the second starting material which is/are provided in a coiled-up form.

This achieves the technical advantage, for example, that reduced tool costs are incurred for the parts of the container during fabrication by deep-drawing.

This further achieves the technical advantage that the parts of the container preferred in automotive engineering can be produced by deep-drawing of films or foils. Furthermore, metallic parts of the container having a smaller thickness can also be produced using deep-drawing of metal foils from the reel.

According to an advantageous embodiment, the lower part is created from a first starting material and/or the upper part is created from a second starting material by punching or stamping.

According to another preferred embodiment, the receiving element is an electrical active element, in particular a populated printed circuit board.

According to another preferred embodiment, the method comprises the step of electrically contacting the receiving element received by the lower part.

According to another preferred embodiment, the method comprises the step of electrically checking the functionality of the electrically contacted receiving element.

According to another preferred embodiment, the method comprises the step of providing plastic as the first starting material and/or as the second starting material.

According to another preferred embodiment, the first starting material corresponds to the second starting material.

According to another preferred embodiment, the creation of the upper part in the second processing region of the processing device takes place in the immediate surroundings of, in particular adjacent to, the creation of the lower part in the first processing region of the processing device.

According to another preferred embodiment, the upper part is fed from the second processing region into the first processing region in an automated manner.

According to another preferred embodiment, the lower part receives the receiving element in the first processing region of the processing device before the upper part and the lower part are joined together to form the container in the first processing region of the processing device.

According to an advantageous embodiment, the lower part receives the receiving element by screwing and/or by hot deforming a connection element.

According to a second aspect, the object is achieved by a container having an upper part, a lower part and a receiving element provided according to a method according to at least one of the previous preferred embodiments.

DESCRIPTION OF THE FIGURES

Further embodiment examples are explained in greater detail, with reference to the attached figures, wherein.

DETAILED DESCRIPTION OF THE FIGURES

Figure 1:
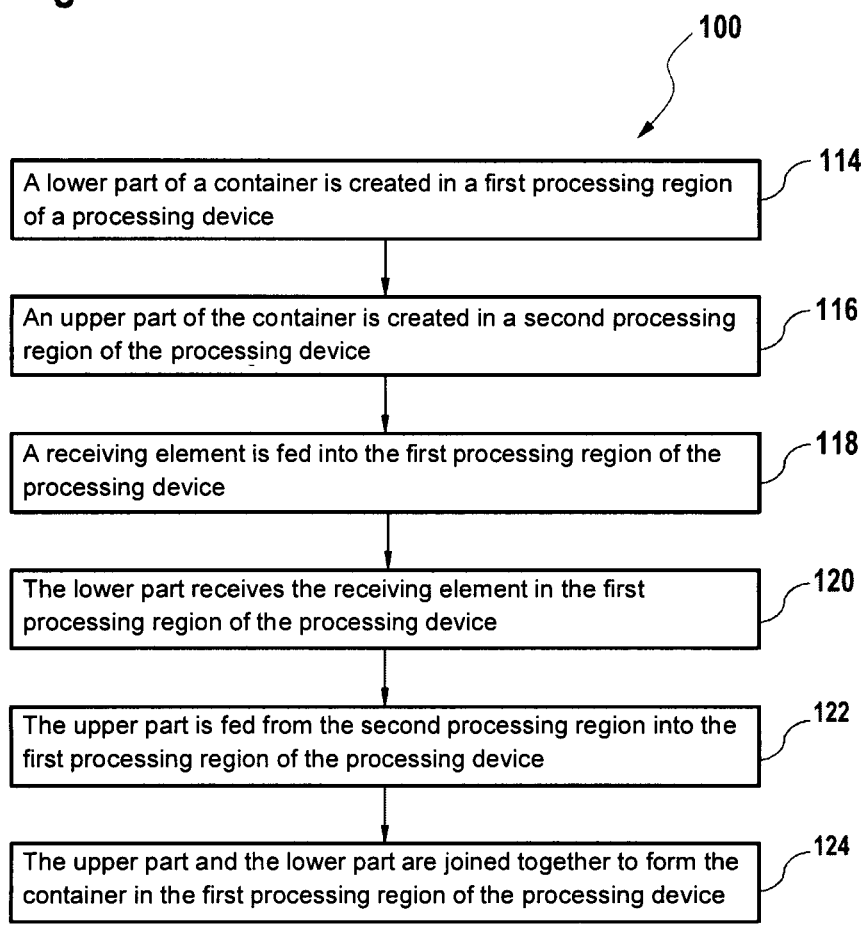
FIG. 1 shows a schematic representation of a method for producing a container.

Reference is made to the attached drawings in the following detailed description, which drawings form a part hereof and which show specific embodiments, in which the invention can be executed, for illustrative purposes. It is understood that other embodiments can also be used, and structural or logical changes can be made, without deviating from the concept of the present invention. The following detailed description is therefore not to be understood in a restrictive sense. It is further understood that the features of the various embodiment examples described herein can be combined with one another, unless otherwise specifically indicated.

The aspects and embodiments are described with reference to the drawings, wherein the same reference numerals generally refer to the same elements. In the following description, numerous specific details are set out for explanatory purposes, in order to convey a detailed understanding of one or more aspects of the invention. However, it can be obvious to a person skilled in the art that one or more aspects or embodiments can be executed with a lower degree of the specific details. In other cases, known structures and elements are represented in a schematic form, in order to make it easier to describe one or more aspects or embodiments. It is understood that other embodiments can be used, and structural or logical changes can be made, without deviating from the concept of the present invention.

Even though a particular feature or a particular aspect of an embodiment may have been disclosed with respect to only one of multiple implementations, such a feature or such an aspect can, in addition, be combined with one or more other features or aspects of the other implementations as may be desired and advantageous for a given or particular application. Furthermore, to the extent that the expressions "contain", "have", "with" or other variants thereof are used, either in the detailed description or the claims, such expressions are to be inclusive in a similar way to the expression "comprise". The expressions "coupled" and "connected" may have been used, together with derivations thereof. It is understood that such expressions are used in order to indicate that two elements cooperate or interact with one another irrespective of whether they are in direct physical or electrical contact, or are not in direct contact with one another. In addition, the expression "for example" is simply to be understood as an example instead of denoting the best or optimum. The following description is therefore not to be understood in a restrictive sense.

FIG. 1 shows a schematic representation of a method 100 for producing a container 102. In this embodiment, the method 100 comprises at least the following steps: a lower part 110 of the container 102 is created 114 in a first processing region 115a of a processing device 115, an upper part 108 of the container 102 is created 116 in a second processing region 115b of the processing device 115, a receiving element 112 is fed 118 into the first processing region 115a of the processing device 115, the lower part 110 receives 120 the receiving element 112 in the first processing region 115a of the processing device 115, the upper part 108 is fed 122 from the second processing region 115b into the first processing region 115a of the processing device 115 and the upper part 108 and the lower part 110 are joined together 124 to form the container 102 in the first processing region 115a of the processing device 115.

The method 100 has, for example, the technical advantage that the upper part 108 and the lower part 110 of the container 102 can be produced in the same processing device 115.

Figure 2:
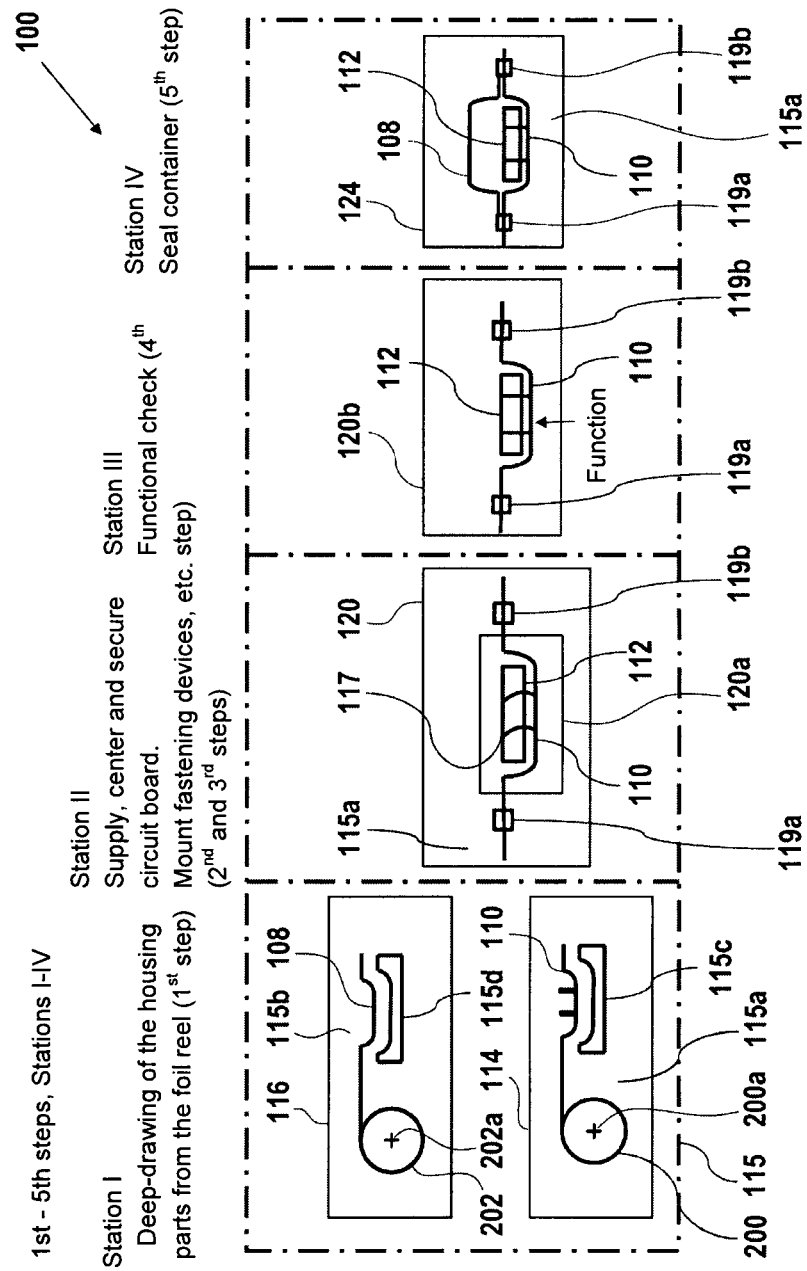
FIG. 2 shows another schematic representation of a method for producing a container.

FIG. 2 shows another schematic representation of a method 100 for producing a container 102. In this embodiment example, the method 100 comprises four stations as well as five steps for producing the container 102.

In station I (step 1), the lower part 110 and the upper part 108 of the container 102 are produced. The lower part 110 can be created 114 from a first starting material 200 in a first processing region 115a of a processing device 115. The upper part 108 can be created 116 from a second starting material 202 in a second processing region 115b of the processing device 115. The lower part 110 and the upper part 108 can be produced by reshaping using a foil or film deep-drawing method of the corresponding starting material, or respectively 200 and 202, by means of a vacuum (if necessary with the aid of an excess pressure), wherein the starting materials 200 and 202 are coiled up on a reel or respectively 200a and 202a. The deep-drawing tools 115c and 115d can be integrated into the entire processing device 115.

In station II, in step 2, the receiving element 112 can be fed 118 into the first processing region 115a of the processing device 115, and said receiving element can be received 120 by the lower part 110 in the first processing region 115a. The receiving element 112 can be an electrically active element, in particular a completely populated printed circuit board, and it can be automatically received 120 by the lower part 110. On being received 120, the receiving element 112 can be centered by means of pins 117 provided on the housing side.

In station II, in step 3, the receiving element 112, for example a printed circuit board, can be held down and fixed. This can be effected by hot deforming the centering pins 117 provided on the housing side, optionally also by screwing with plastic screws (not shown). Steps 2 and 3 can be carried out on the same station (II) of the processing device 115.

The method 100 can additionally comprise the step of electrically contacting 120a the receiving element 112 received by the lower part 110. Furthermore, metallic fastening parts 119a and 119b can be mounted, preferably riveted, in the upper part 108 or in the lower part 110.

In station III (step 4), the functionality of the electrically contacted receiving element 112, for example of a populated printed circuit board, can be checked 120b.

In station IV (step 5), the upper part 108 can be fed 122 from the second processing region 115b of the processing device 115 into the first processing region 115a of the processing device 115. Furthermore, the upper part 108 and the lower part 110 can be joined together 124 to form the container 102 in the first processing region 115a of the processing device 115. The upper part 108, for example a lid, can be automatically supplied and can be selectively or respectively extensively welded to the lower part 110. If necessary, the upper part 108 can also be clipped, depending on the functional requirement.

Producing the upper part 108 and the lower part 110 using the deep-drawing method from the reels 200a and 202a makes possible interlinked fabrication of the container 102 on a processing device 115.

Figure 3:
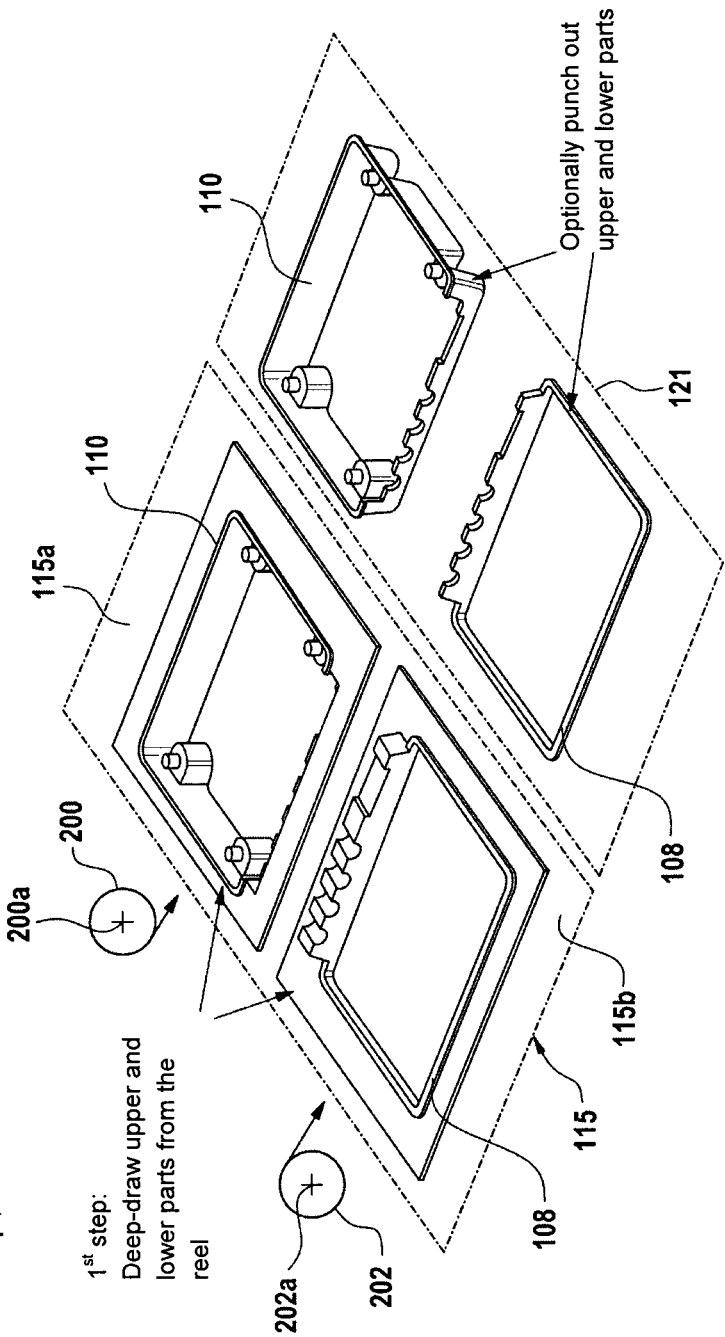
FIG. 3 shows parts of a container.

FIG. 3 shows parts of a container 102, which can be created in the first step of station I according to the description of FIG. 2. In the first step of station I, the upper part 108 and the lower part 110 of the container 102 can be created by means of a deep-drawing method. The lower part 110 can be created from a reel 200a, which comprises a first starting material 200, in a first processing region 115a. The upper part 108 can be created from a reel 202a, which comprises a second starting material 202, in a second processing region 115b. The processing device 115 can comprise the first processing region 115a and the second processing region 115b. FIG. 3 shows an optional step of station I, which comprises punching out 121 the upper part 108 and the lower part 110 of the container 102.

Figure 4:
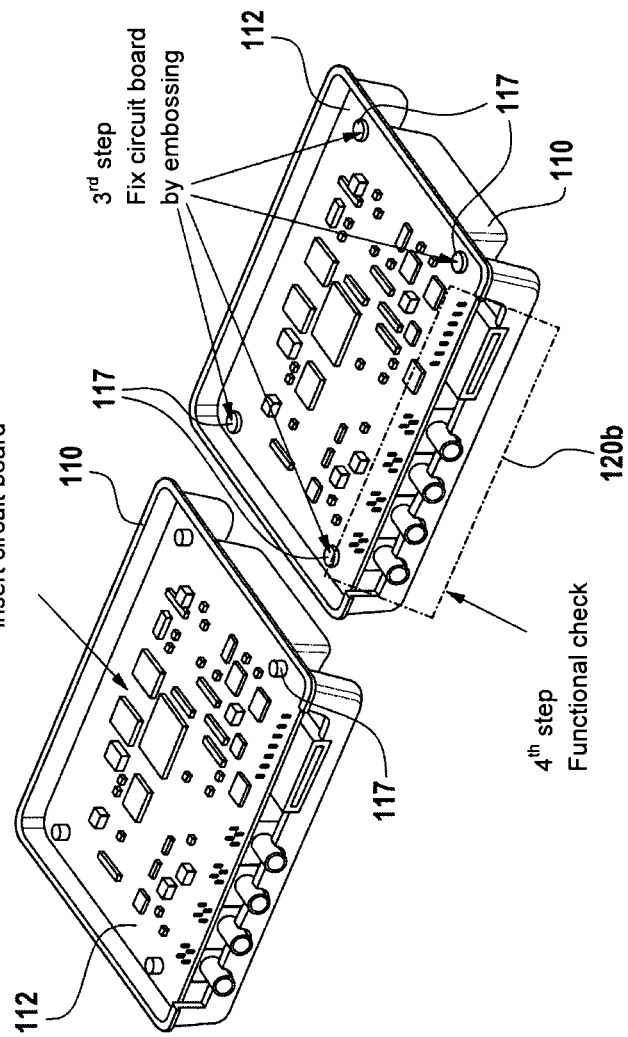
FIG. 4 shows parts of a container.

FIG. 4 shows parts of a container 102. Parts of the container 102, which can be created in station II and station III according to the description of FIG. 2, are shown in FIG. 4. In this embodiment example, the receiving element 112, for example a circuit board, can be fed 118 and inserted into the lower part 110 of the container 102 (step 2 according to the description of FIG. 2). The circuit board can also be fixed by pins 117 (step 3 according to the description of FIG. 2). Furthermore, the function of the circuit board can be checked 120b (step 4 according to the description of FIG. 2).

Figure 5:
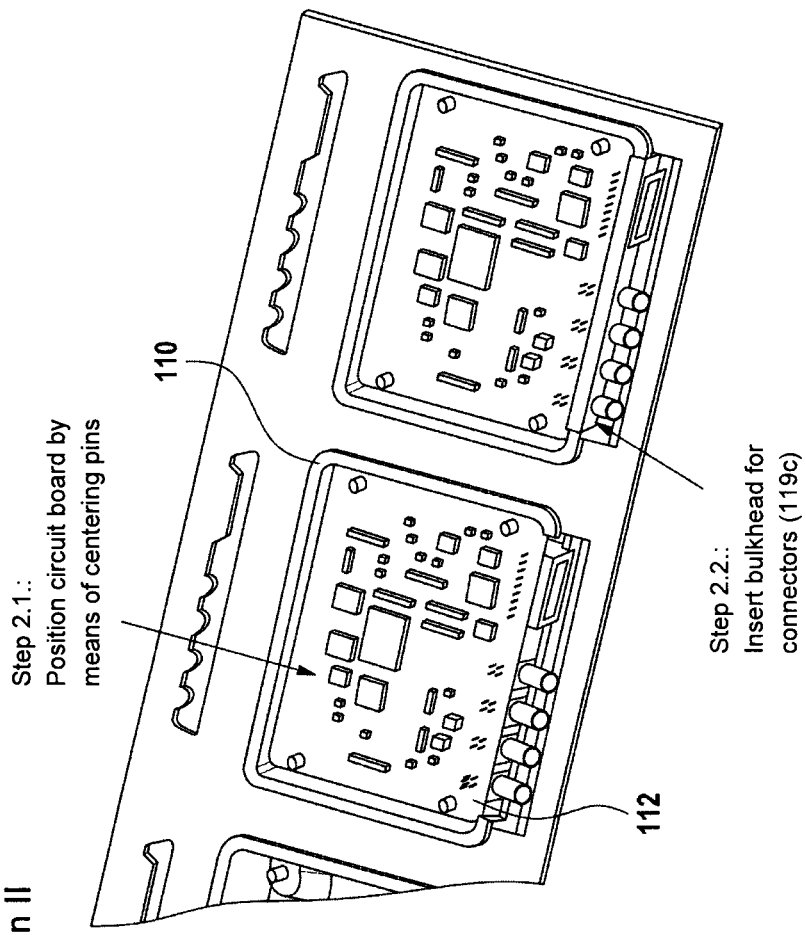
FIG. 5 shows parts of a container.

FIG. 5 shows parts of a container 102. Step 2 of station II according to the description of FIG. 2 is explained in this embodiment example. An intermediate piece, a "bulkhead", can, if necessary, be punched out of a foil for corresponding connector designs on the receiving element 112, for example on a populated printed circuit board, and it can be clipped 119c or introduced into the lower part 110 of the container 102.

Figure 6:
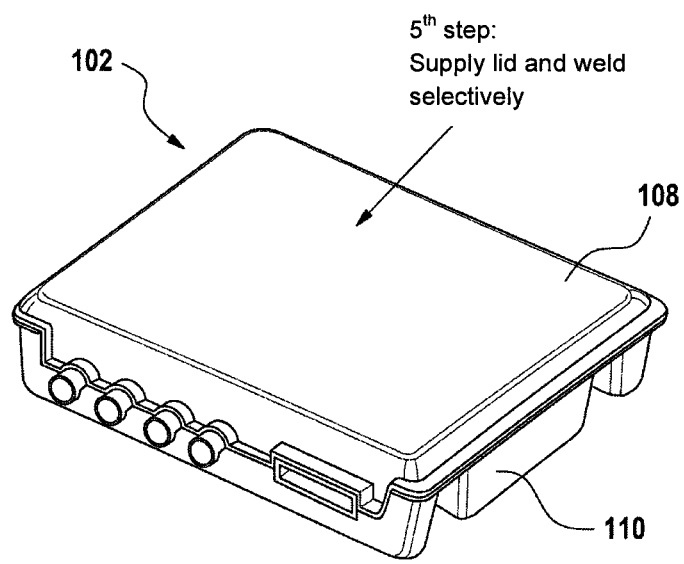
FIG. 6 shows a container.

FIG. 6 shows a container 102. The container 102 comprises the upper part 108, for example a lid, and the lower part 110. Step 5 of station IV according to the description of FIG. 2 is explained in this embodiment example. The lid can be supplied and then selectively welded.

Figure 7:
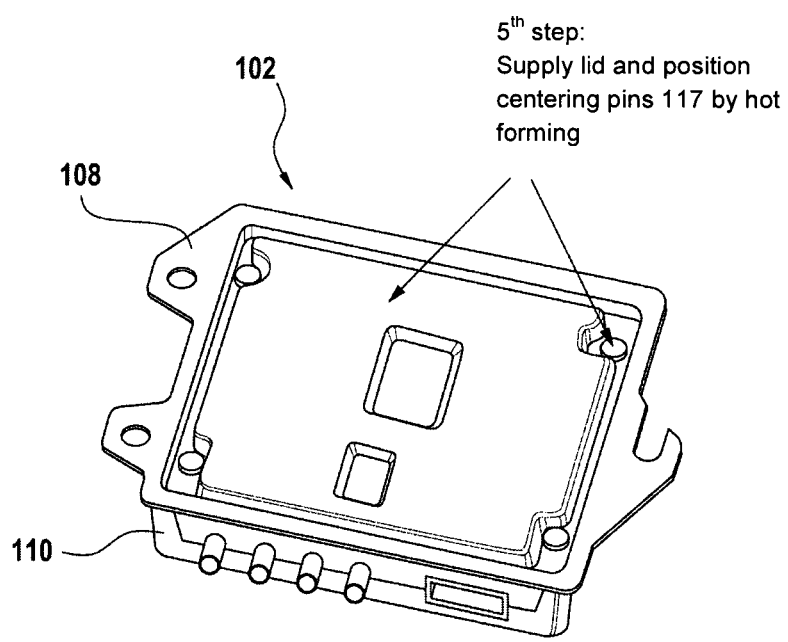
FIG. 7 shows a container.

FIG. 7 shows a container 102. The container 102 comprises the upper part 108, for example a lid, the lower part 110 and the receiving element 112 (not shown in FIG. 7). Step 5 of station IV according to the description of FIG. 2 is explained in this embodiment example. The upper part 108 can hold down the receiving element 112, for example a populated circuit board, and the upper part 108 can be connected to the lower part 110 by hot forming of the centering pins 117, optionally by screwing with plastic screws (not represented), to form the finished unit in this embodiment example. The upper part 108 and the lower part 110 can, depending on the requirements, be deep-drawn from a metal foil.

Figure 8:
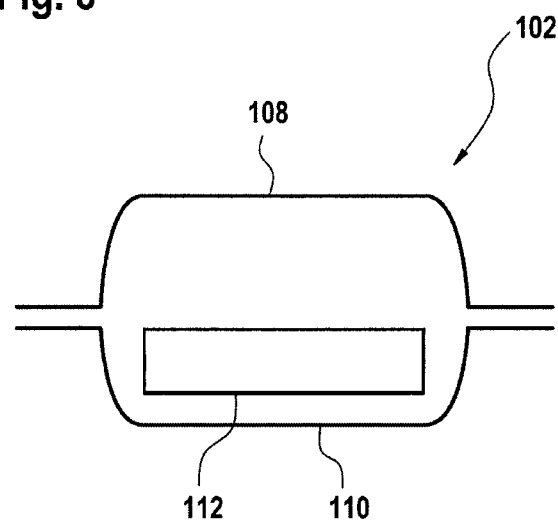
FIG. 8 shows a schematic representation of a container.

FIG. 8 shows a schematic representation of a container 102. The container 102 comprises the upper part 108, the lower part 110 and the receiving element 112. The container 102 can be produced according to the method 100.

This production of the container 102, in particular the fabrication and mounting concept, only necessitates low costs. Furthermore, no supplier or logistics expenditure is incurred for the production of the upper part 108 and lower part 110 of the container 102.

The container 102 can, in particular, comprise electronic units and sensors having mounted electronic modules (populated printed circuit boards) and can, in particular, be used in the automotive industry.

LIST OF REFERENCE NUMERALS

100 Method
102 Container
108 Upper part
110 Lower part
112 Receiving element
114 Creating
115 Processing device
115a Processing region
115b Processing region
115c Deep-drawing tool
115d Deep-drawing tool
116 Creating
117 Pin
118 Feeding
119a Fastening part
119b Fastening part
119c Clipping
120 Receiving
120a Contacting
120b Checking
121 Punching out
122 Feeding
124 Joining together
200 Starting material
200a Reel
202 Starting material
202a Reel

The invention claimed is:

1. A method comprising the steps:
a) producing a container lower part from a first starting material in a first processing region of a processing apparatus;
b) producing a container upper part from a second starting material in a second processing region of the processing apparatus;
c) feeding an electronic module into the first processing region of the processing apparatus;
d) after the step c), positioning, mounting and securing the electronic module in the container lower part in the first processing region of the processing apparatus;
e) after the step d), electrically contacting the electronic module in the container lower part;
f) separating the container lower part from a remainder of the first starting material;
g) separating the container upper part from a remainder of the second starting material;
h) feeding the container upper part from the second processing region into the first processing region of the processing apparatus; and
i) after the steps e), f), g) and h), in the first processing region of the processing apparatus, joining together the container upper part and the container lower part to form a container that encloses the electronic module therein.

2. The method according to claim 1, wherein the steps f) and g) are performed before the step d).

3. The method according to claim 1, wherein the separating in the step f) comprises punching-out the container lower part from the remainder of the first starting material, and the separating in the step g) comprises punching-out the container upper part from the remainder of the second starting material.

4. The method according to claim 1, wherein the steps a) and b) are carried out with the first starting material and the second starting material both extending along a same common plane respectively in the first processing region and the second processing region of the processing apparatus, and wherein the container lower part and the container upper part are respectively produced adjacent to one another on the same common plane.

5. The method according to claim 4, wherein the first starting material corresponds to the second starting material as the same single common starting material.

6. The method according to claim 1, wherein the producing of the lower part and/or the producing of the upper part comprises reshaping the first starting material and/or the second starting material respectively.

7. The method according to claim 6, wherein the reshaping comprises deep-drawing.

8. The method according to claim 1, wherein the electronic module comprises an electrical active element.

9. The method according to claim 1, wherein the electronic module comprises a pre-populated printed circuit board.

10. The method according to claim 1, further comprising, in connection with the step e), electrically checking a functionality of the electronic module after the step d) and before the step i).

11. The method according to claim 1, wherein the positioning, the mounting and the securing of the electronic module in the step d) comprises hot-deforming a connection element provided on the container lower part so as to connect the electronic module directly to the container lower part via the connection element.

12. The method according to claim 11, wherein the connection element comprises a centering pin protruding from a portion of the container lower part into an interior space bounded by the container lower part, and wherein the positioning, the mounting and the securing of the electronic module further comprises positioning the electronic module onto the centering pin and then embossing the centering pin to secure the electronic module.

13. The method according to claim 12, wherein the securing of the electronic module further comprises positioning the container upper part onto the centering pin so that the centering pin protrudes outwardly through the container upper part, whereby the container upper part holds down the electronic module onto the container lower part, and then the joining together of the container upper part and the container lower part comprises hot-deforming the centering pin.

14. The method according to claim 1, wherein the positioning, the mounting and the securing of the electronic module in the step d) comprises screwing the electronic module to the container lower part with plastic screws.

15. The method according to claim 1, further comprising forming a container intermediate piece from the first starting material adjacent to the container lower part, separating the container intermediate piece from the remainder of the first starting material, and connecting the container intermediate piece onto the container lower part after the step d) and before the step i).

* * * * *